United States Patent
Masada

(10) Patent No.: US 10,872,768 B2
(45) Date of Patent: Dec. 22, 2020

(54) METHOD OF MANUFACTURING EPITAXIAL SILICON WAFER, EPITAXIAL SILICON WAFER, AND METHOD OF MANUFACTURING SOLID-STATE IMAGE SENSING DEVICE

(71) Applicant: SUMCO CORPORATION, Tokyo (JP)

(72) Inventor: Ayumi Masada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/325,256

(22) PCT Filed: Apr. 25, 2017

(86) PCT No.: PCT/JP2017/016438
§ 371 (c)(1),
(2) Date: Feb. 13, 2019

(87) PCT Pub. No.: WO2018/037626
PCT Pub. Date: Mar. 1, 2018

(65) Prior Publication Data
US 2019/0189442 A1 Jun. 20, 2019

(30) Foreign Application Priority Data
Aug. 22, 2016 (JP) .................... 2016-162079

(51) Int. Cl.
*H01L 21/02* (2006.01)
*H01L 27/146* (2006.01)
(Continued)

(52) U.S. Cl.
CPC .... *H01L 21/02694* (2013.01); *H01L 21/0245* (2013.01); *H01L 21/02381* (2013.01);
(Continued)

(58) Field of Classification Search
None
See application file for complete search history.

(56) References Cited

U.S. PATENT DOCUMENTS 6,930,375 B2 * 8/2005 Falster ............... H01L 21/3226
257/618
7,803,228 B2 9/2010 Kurita et al.
(Continued)

FOREIGN PATENT DOCUMENTS

JP  2012-059849 A  3/2012
JP  2013-219300 A  10/2013
(Continued)

OTHER PUBLICATIONS

Preferred Float Zone (PFZ) Silicon for Power Electronics, Application Note, Topsil, Sep. 2010. (Year: 2010).*
(Continued)

*Primary Examiner* — J. E. Schoenholtz
(74) *Attorney, Agent, or Firm* — Greenblum & Bernstein, P.L.C.

(57) ABSTRACT

Provided are an epitaxial silicon wafer which can reduce metal contamination by exerting higher gettering capability and a method of manufacturing the same. In a method of manufacturing an epitaxial silicon wafer which includes a silicon wafer, a first silicon epitaxial layer formed on the silicon wafer, a first modifying layer in which carbon is implanted in a surface layer portion of the first silicon epitaxial layer, and a second silicon epitaxial layer on the first modifying layer, the peak concentration of the oxygen concentration profile in the first modifying layer after formation of the second silicon epitaxial layer is set to $2\times10^{17}$ atoms/cm$^3$ or less and the oxygen concentration of the second silicon epitaxial layer is set to be equal to or less than the SIMS detection lower limit value.

11 Claims, 4 Drawing Sheets

(51) Int. Cl.
H01L 21/205 (2006.01)
H01L 21/20 (2006.01)
H01L 21/265 (2006.01)
H01L 21/322 (2006.01)
H01L 29/16 (2006.01)

(52) U.S. Cl.
CPC ........ H01L 21/02532 (2013.01); H01L 21/20 (2013.01); H01L 21/205 (2013.01); H01L 21/265 (2013.01); H01L 21/322 (2013.01); H01L 27/146 (2013.01); H01L 27/14687 (2013.01); H01L 29/16 (2013.01)

(56) References Cited

U.S. PATENT DOCUMENTS

| | | | |
|---|---|---|---|
| 9,425,345 | B2* | 8/2016 | Hoshi ............... H01L 27/14843 |
| 10,153,323 | B2 | 12/2018 | Okuyama |
| 10,224,203 | B2 | 3/2019 | Hirose et al. |
| 2014/0080247 | A1* | 3/2014 | Kadono ............. H01L 27/1464 438/73 |
| 2016/0181311 | A1 | 6/2016 | Kadono et al. |
| 2017/0256668 | A1 | 9/2017 | Okuyama et al. |
| 2018/0374891 | A1 | 12/2018 | Kadono et al. |
| 2019/0027533 | A1 | 1/2019 | Okuyama |

FOREIGN PATENT DOCUMENTS

| | | |
|---|---|---|
| JP | 2014-099481 A | 5/2014 |
| JP | 2014-099482 A | 5/2014 |
| JP | 2015-204316 A | 11/2015 |
| KR | 10-2015-0127740 A | 11/2015 |
| WO | 2012/157162 A1 | 11/2012 |
| WO | 2013/153724 A1 | 10/2013 |

OTHER PUBLICATIONS

Hiroshima, Y., et al. "Elimination of Fixed Pattern Noise in Super-8 Format CCD Image Sensor by the Use of Epitaxial Wafers." 1984 International Electron Devices Meeting, 1984, doi:10.1109/iedm.1984.190634. (Year: 1984).*

Secondary Ion Mass Spectrometry Theory Tutorial, downloaded from URL <http://pprco.tripod.com/SIMS/Theory.htm> on Jan. 16, 2020. (Year: 2020).*

Kurita, Kazunari, et al. "Proximity Gettering Design of Hydrocarbon—Molecular—Ion—Implanted Silicon Wafers Using Dark Current Spectroscopy for CMOS Image Sensors." Sensors, vol. 19, No. 9, 2019, p. 2073., doi:10.3390/s19092073. (Year: 2019).*

Czochralski process vs Float Zone: two growth techniques for mono-crystalling silicon, Meroli, S., downloaded from URL<https://meroli.web.cern.ch/Lecture_silicon_floatzone_czochralski.html> on Apr. 4, 2020 (Year: 2020).*

Robbins, Mark S., et al. "Detailed Characterisation of a New Large Area CCD Manufactured on High Resistivity Silicon." Sensors, Cameras, and Systems for Industrial, Scientific, and Consumer Applications XII, 2011, doi:10.1117/12.876627. (Year: 2011).*

Swartz, P., "Oxygen Incorporation During Low-Temperature Chemical Vapor Deposition and Its Effects on the Electronic Properties of Epitaxial Si and Si1–xGe1–x Films", Department of Electrical Engineering, Princeton University, diss. (Year: 1992).*

Schwartz, P. V. "Oxygen Incorporation during Low Temperature Chemical Vapor Deposition Growth of Epitaxial Silicon Films." Journal of The Electrochemical Society, vol. 141, No. 5, 1994, p. 1284., doi:10.1149/1.2054911. (Year: 1994).*

International Preliminary Report on Patentability issued in World Intellectual Property Organization Patent Application No. PCT/JP2017/016438, dated Feb. 26, 2019, along with an English translation thereof.

International Search Report issued in International Bureau of WIPO Patent Application No. PCT/JP2017/016438, dated Aug. 1, 2017.

Office Action issued in Taiwan family member Patent Appl. No. 106124965, dated May 24, 2018.

Office Action issued in Taiwanese family member Patent Appl. No. 106124965, dated Mar. 18, 2019, along with an English translation thereof.

Japanese Office Action for JP 2016-162079, dated Sep. 10, 2019, and English-language translation thereof.

Office Action for KR App. No. 10-2019-7000949, dated Mar. 11, 2020 (w/ translation).

Office Action for DE App. No. 11 2017 004 171.6 dated Oct. 27, 2020 (w/ translation).

* cited by examiner

METHOD OF MANUFACTURING EPITAXIAL SILICON WAFER, EPITAXIAL SILICON WAFER, AND METHOD OF MANUFACTURING SOLID-STATE IMAGE SENSING DEVICE

TECHNICAL FIELD

The present disclosure relates to a method of manufacturing an epitaxial silicon wafer, an epitaxial silicon wafer, and a method of manufacturing a solid-state image sensing device, more particularly to a method of manufacturing an epitaxial silicon wafer which exerts higher gettering capability.

BACKGROUND

Metal contamination is one of the factors that deteriorate the characteristics of a semiconductor device. For example, for a back-illuminated solid-state image sensing device, metals mixed into a semiconductor epitaxial wafer to be a substrate of the device cause increased dark current in the solid-state image sensing device, which results in the formation of defects referred to as white spot defects. In recent years, back-illuminated solid-state image sensing devices have been widely used in digital video cameras and mobile phones such as smartphones because they include a wiring layer and other layers disposed at a position below a sensor unit and therefore can directly receive light from the outside and take sharper images or motion pictures even in dark scenes. It has therefore been desired in the art to reduce white spot defects as much as possible.

Metal contamination of silicon wafers mainly occurs in the process of manufacturing an epitaxial silicon wafer and a process of manufacturing a solid-state image sensing device (device fabrication process). Metal contamination that occurs during the former process of manufacturing an epitaxial silicon wafer may be due to heavy metal particles from components of an epitaxial growth furnace or heavy metal particles caused by metal corrosion of piping materials of the furnace due to chlorine-based gas used in epitaxial growth in the furnace. In recent years, such metal contaminations have been reduced to some extent by replacing components of epitaxial growth furnaces with highly corrosion resistant materials, but not to a sufficient extent. On the other hand, in the latter process of manufacturing a solid-state image sensing device, heavy metal contamination of epitaxial silicon wafers would occur in process steps such as ion implantation, diffusion, and oxidizing heat treatment in the manufacturing process.

Metal contamination of epitaxial silicon wafers is generally avoided by forming a gettering layer in the epitaxial silicon wafer for trapping metals.

One of the techniques for forming a gettering layer involves irradiating a silicon epitaxial layer with cluster ions. PTL 1 discloses a technique for forming an epitaxial silicon wafer which includes: irradiating a silicon wafer, or a first silicon epitaxial layer formed on the silicon wafer, with carbon-containing cluster ions to form in a surface layer portion of the silicon wafer or the first silicon epitaxial layer a modifying layer in which carbon is solidly dissolved; and forming on the modifying layer a second silicon epitaxial layer that becomes a device layer. In this technique, the modifying layer functions as a gettering layer. PTL 1 also states that the gettering capability improves with increasing concentration of carbon in the modifying layer, with the carbon peak concentration being preferably $1 \times 10^{15}$ to $1 \times 10^{22}$ atoms/cm$^3$.

CITATION LIST

Patent Literature

[PTL 1] WO2012157162A

SUMMARY

Technical Problem

PTL 1 demonstrates that a modifying layer formed by irradiation with cluster ions exhibits a higher gettering capability than an ion-implanted region obtained by implanting monomer ions (single ions). However, in order to further improve the characteristics of semiconductor devices, there remains a need to provide an epitaxial silicon wafer having higher gettering capability.

In view of the foregoing problem, an object of the present disclosure is to provide an epitaxial silicon wafer capable of reducing metal contamination by exerting higher gettering capability, and a method of manufacturing the same.

Solution to Problem

Indeed, in order to increase the gettering capability, it is effective to increase the peak concentration of the carbon concentration profile in a modifying layer formed by implanting carbon-containing ions. At this point of time, the amount of oxygen trapped in the modifying layer also increases, so does the peak concentration of the oxygen concentration profile in the modifying layer. It has been unknown how the concentration profile of oxygen trapped in this modifying layer affects the gettering capability.

The inventors focused on the peak concentration of the oxygen concentration profile in the modifying layer after forming a device layer and made extensive studies on this point. As a result, they discovered that the gettering capability increases with decreasing peak concentration of the oxygen concentration profile in the modifying layer. The inventors also discovered that there is a remarkable increase in the gettering capability when the peak concentration of the oxygen concentration profile in the modifying layer is set to $2 \times 10^{17}$ atoms/cm$^3$ or less and the oxygen concentration of the silicon epitaxial layer to be a device layer is set to $2 \times 10^{16}$ atoms/cm$^3$ or less (hereinafter referred to as "SIMS detection lower limit value or less").

The present disclosure has been accomplished based on the findings described above and the gist thereof is as follows:

(1) A method of manufacturing an epitaxial silicon wafer, comprising:
a first step of forming a first silicon epitaxial layer on a silicon wafer;
a second step of irradiating the first silicon epitaxial layer with first ions containing carbon to form in a surface layer portion of the first epitaxial layer a first modifying layer in which the carbon is implanted; and
a third step of forming a second silicon epitaxial layer on the first modifying layer,
wherein after the third step an epitaxial silicon wafer is obtained wherein a peak concentration of an oxygen concentration profile in the first modifying layer is $2 \times 10^{17}$ atoms/cm³ or less and an oxygen concentration of the second silicon epitaxial layer is $2\times10^{16}$ atoms/cm³ or less.

(2) The method according to (1) above, wherein the first ions are cluster ions which contain carbon as a constituent element.

(3) The method according to (1) or (2) above, wherein in the first step a thickness of the first silicon epitaxial layer is determined according to an oxygen concentration of the silicon wafer such that the surface layer portion before the second step has an oxygen concentration of $2\times10^{16}$ atoms/cm³ or less.

(4) The method according to (1) or (2) above, further comprising, before the first step, irradiating the silicon wafer with second ions containing carbon to form in a surface layer portion of the silicon wafer a second modifying layer in which the carbon is implanted, such that the surface layer portion of the first silicon epitaxial layer before the second step has an oxygen concentration of $2\times10^{16}$ atoms/cm³ or less.

(5) The method according to (4) above, wherein the second ions are cluster ions which contain carbon as a constituent element.

(6) The method according to any one of (1) to (5) above, wherein the first silicon epitaxial layer has a dopant concentration that is equal to or less than a dopant concentration of the second silicon epitaxial layer.

(7) The method according to (6) above, wherein the first silicon epitaxial layer is not doped with a dopant.

(8) An epitaxial silicon wafer comprising:
a silicon wafer;
a first silicon epitaxial layer formed on the silicon wafer;
a first modifying layer in which carbon is implanted, the first modifying layer being formed in a surface layer portion of the first silicon epitaxial layer; and
a second silicon epitaxial layer formed on the first modifying layer,
wherein a peak concentration of an oxygen concentration profile in the first modifying layer is $2\times10^{17}$ atoms/cm³ or less and an oxygen concentration of the second silicon epitaxial layer is $2\times10^{16}$ atoms/cm³ or less.

(9) The epitaxial silicon wafer according to (8) above, wherein the first silicon epitaxial layer has a dopant concentration that is equal to or less than a dopant concentration of the second silicon epitaxial layer.

(10) The epitaxial silicon wafer according to (9) above, wherein the first silicon epitaxial layer is not doped with a dopant.

(11) A method of manufacturing a solid-state image sensing device, comprising:
forming a solid-state image sensing device in the second silicon epitaxial layer of the epitaxial silicon wafer manufactured by the method according to any one of (1) to (7) above or of the epitaxial silicon wafer according to any one of (8) to (10) above.

Advantageous Effect

According to the present disclosure, it is possible to provide an epitaxial silicon wafer capable of reducing metal contamination by exerting higher gettering capability, and a method of manufacturing the same.

BRIEF DESCRIPTION OF THE DRAWINGS

In the accompanying drawings.

DETAILED DESCRIPTION

Figure 1A:
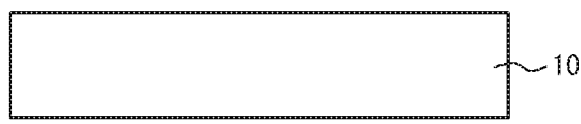
FIGS. 1A to 1E are schematic cross-sectional views illustrating a method of manufacturing an epitaxial silicon wafer 100 according to a first embodiment of the present disclosure.

Hereinafter, embodiments of the present disclosure will be described in detail with reference to the drawings. In principle, like elements are denoted by like reference numerals and redundant description thereof is not provided. In FIGS. 1A to 1E and FIGS. 2A to 2G, for convenience of explanation, unlike the actual thickness ratio, first and second silicon epitaxial layers 12, 16 and first and second modifying layers 14, 22 are shown exaggerated in thickness with respect to a silicon wafer 10.

(Method of Manufacturing Epitaxial Silicon Wafer)

FIGS. 1A to 1E show a first embodiment of a method of manufacturing an epitaxial silicon wafer of the present disclosure, and FIGS. 2A to 2G show a second embodiment thereof.

Figure 1B:
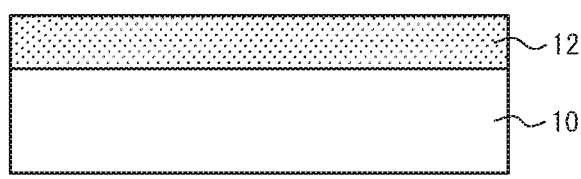
Figure 1C:
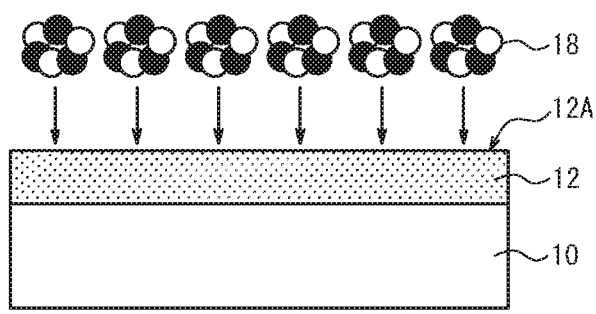
Figure 1D:
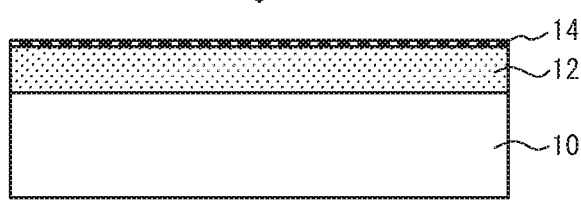
Figure 1E:
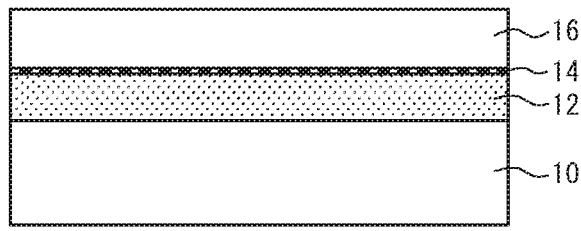

First, referring to FIGS. 1A to 1E, a method of manufacturing an epitaxial silicon wafer 100 according to a first embodiment of the present disclosure will be described. In the present embodiment, first, a first silicon epitaxial layer 12 is formed on a silicon wafer 10 (FIGS. 1A and 1B). Next, the first silicon epitaxial layer 12 is irradiated with cluster ions 18 (first ions) containing carbon as a constituent element to form in a surface layer portion of the first silicon epitaxial layer 12 a first modifying layer 14 in which the carbon is solidly dissolved (FIGS. 1C and 1D). Next, a second silicon epitaxial layer 16 is formed on the first modifying layer 14 (FIG. 1E). FIG. 1E is a schematic cross-sectional view of an epitaxial silicon wafer 100 obtained by this manufacturing method.

Examples of the silicon wafer 10 include bulk monocrystalline silicon wafers with no silicon epitaxial layer on the surface. Bulk monocrystalline silicon wafers are generally suitable for the manufacture of back-illuminated solid-state image sensing devices. From the viewpoint of reducing the diffusion of oxygen into the first and second silicon epitaxial layers 12, 16, the silicon wafer 10 preferably has an oxygen concentration of $18\times10^{17}$ atoms/cm³ or less, more preferably $8\times10^{17}$ atoms/cm³ or less. However, from the viewpoint of reducing the occurrence of slip and dislocation during epitaxial growth, the silicon wafer 10 preferably has an oxygen concentration of $2\times10^{17}$ atoms/cm³ or more. A silicon wafer that has an oxygen concentration range falling within the range described above can be prepared by slicing, using a wire saw or other tool, a monocrystalline silicon ingot obtained by the Czochralski method (CZ method), which is commonly used in the art. Of note, in the present disclosure, it is possible to reduce the oxygen concentration of the device layer to the SIMS detection lower limit or less by the method described later without having to use a low-oxygen silicon wafer having an oxygen concentration of $1\times10^{17}$ atoms/cm³ or less.

Carbon and/or nitrogen may be doped into the silicon wafer 10 in order to obtain higher gettering capability. Further, the silicon wafer 10 may be made n-type or p-type by doping with any dopant.

The first and second silicon epitaxial layers 12, 16 can be formed by chemical vapor deposition (CVD) under general conditions. For example, using hydrogen as a carrier gas, a source gas such as dichlorosilane or trichlorosilane gas can be introduced into a chamber for epitaxial growth by CVD at about 1,000° C. to 1,150° C. The second silicon epitaxial layer 16 becomes a device layer for manufacturing a back-illuminated solid-state image sensing device.

The second silicon epitaxial layer 16 may be made n-type or p-type by doping with any dopant, with the dopant concentration being preferably $9 \times 10^{13}$ atoms/cm$^3$ to $1 \times 10$'s atoms/cm$^3$. It is preferred that the dopant concentration of the first silicon epitaxial layer 12 is equal to or less than the dopant concentration of the second silicon epitaxial layer 16. It is more preferred that the first silicon epitaxial layer 12 is a silicon epitaxial layer which is not doped with a dopant because it is possible to prevent the gettering sites formed in the first modifying layer 14 from being occupied by the dopant and hence higher gettering capability can be achieved.

From the viewpoint of securing a region for forming a back-illuminated solid-state sensing device, it is preferred that the thickness of the second silicon epitaxial layer 16 ranges from 2 μm to 10 μm. Details of the thickness of the first silicon epitaxial layer 12 will be described later.

Next, the first modifying layer that functions as a gettering layer in the present disclosure will be described. In the present embodiment, as shown in FIGS. 1C and 1D, the first modifying layer 14 is formed by irradiating a surface 12A of the first silicon epitaxial layer with carbon-containing cluster ions (first ions) such that carbon is solidly dissolved in a surface layer portion of the first silicon epitaxial layer 12. As another embodiment, the first ions to be applied may be monomer ions (single ions). However, from the viewpoint of obtaining higher gettering capability, it is preferred to apply cluster ions. As a generator of monomer ions or cluster ions, any or known generator can be used.

When carbon-containing monomer ions are to be applied as the first ions, the monomer ions are implanted at a depth within a predetermined distance from the surface of the first silicon epitaxial layer. The depth of implantation depends on the type of the constituent element of the monomer ions and the acceleration voltage of the monomer ions. In this case, the first silicon epitaxial layer shows a relatively broad carbon concentration profile in the depth direction and the carbon-implanted region (i.e., first modifying layer) has a thickness of approximately 0.5 μm to 1 μm. Herein, "the surface layer portion of the first silicon epitaxial layer" which becomes the first modifying layer is a region approximately 0.5 μm to 1 μm from the surface of the first silicon epitaxial layer when monomer ions are applied.

Monomer ions may be implanted multiple times to implant different types of elements. In particular, in addition to carbon, it is preferred to apply one or more dopant elements selected from the group consisting of boron, phosphorus, arsenic, and antimony. Because different elements trap different impurity metals efficiently, implantation of two or more different elements including carbon allows a broader spectrum of impurity metals to be efficiently trapped. For example, carbon can efficiently trap nickel, whereas boron can efficiently trap copper and iron.

The accelerating voltage of monomer ions generally ranges from 150 to 2,000 keV/atom and may be set as appropriate within this range. The dose of monomer ions is also not particularly limited and can be $1 \times 10^{13}$ atoms/cm$^2$ to $1 \times 10^{16}$ atoms/cm$^2$, for example.

Referring to FIGS. 1C and 1D, when the carbon-containing cluster ions 18 are applied as the first ions, the first modifying layer 14 in which the constituent element of the cluster ions 18 is solidly dissolved is formed in a surface layer portion of the first silicon epitaxial layer 12. In this case, the first silicon epitaxial layer 12 shows a sharp carbon concentration profile in the depth direction compared with a case where monomer ions are applied, and the region where carbon exist (i.e., the first modifying layer 14) has a thickness of approximately 500 nm or less (e.g., about 50 nm to 400 nm). The term "cluster ions" herein mean a cluster of atoms or molecules which are ionized by being given a positive or negative electric charge. A cluster refers to a population of multiple (typically about 2 to 2,000) atoms or molecules bound together. Herein, "the surface layer portion of the first silicon epitaxial layer" which becomes the first modifying layer is a region within approximately 500 nm from the surface of the first silicon epitaxial layer when cluster ions are applied.

The cluster ions 18 to be applied contain carbon as a constituent element. Carbon atoms at lattice sites have a small covalent bond radius compared to silicon single crystals, so that a compression field is produced in the silicon crystal lattice, which results in high gettering capability for attracting impurities between lattices.

It is more preferred that the cluster ions 18 contain as constituent elements two or more different elements, including carbon. In particular, in addition to carbon, it is preferred to apply one or more dopant elements selected from the group consisting of boron, phosphorus, arsenic, and antimony. Because different elements to be deposited trap different impurity metals efficiently, solidly dissolving two or more different elements including carbon makes it possible to address a wider spectrum of metal contaminations.

For example, carbon can efficiently trap nickel, whereas boron can efficiently trap copper and iron.

Compounds to be ionized are not particularly limited. Examples of ionizable carbon source compounds include ethane, methane, propane, benzyl ($C_7H_7$), and carbon dioxide ($CO_2$), and examples of boron source compounds include diborane and decaborane ($B_{10}H_{14}$). For example, when a mixed gas of benzyl and decaborane is used as a material gas, a hydrogen compound cluster can be produced in which carbon, boron and hydrogen are gathered together. Alternatively, when cyclohexane ($C_6H_{12}$) is used as a material gas, cluster ions formed from carbon and hydrogen can be produced. In particular, as a carbon source compound, it is preferred to use cluster $C_nH_m$ ($3 \leq n \leq 16$, $3 \leq m \leq 10$) produced from pyrene ($C_{16}H_{10}$), dibenzyl ($C_{14}H_{14}$) or the like because a small sized cluster ion beam can be easily controlled.

Next, by controlling the acceleration voltage and the cluster size of the cluster ions, the peak position of the concentration profile of the constituent element in the depth direction of the first modifying layer 14 can be controlled. The term "cluster size" herein means the number of atoms or molecules constituting one cluster.

From the viewpoint of obtaining higher gettering capability, it is preferred that cluster ions are applied such that the peak of the carbon concentration profile in the first modifying layer 14 lies at a depth within 150 nm from the surface 12A of the first silicon epitaxial layer. The peak concentration of the carbon concentration profile is preferably $3.8 \times 10^{18}$ atoms/cm$^3$ to $1.2 \times 10^{20}$ atoms/cm$^3$.

As a condition required to set the peak position to fall within the depth range described above, the acceleration voltage of the cluster ions is set to higher than 0 keV/Cluster and less than 100 keV/Cluster, preferably at 80 keV/Cluster or less, more preferably 60 keV/Cluster or less. Further, the cluster size is set to 2 to 100 atoms or molecules, preferably 60 atoms or molecules or less, more preferably 50 atoms or molecules or less.

The dose of cluster ions can be adjusted by controlling irradiation time. In particular, the carbon dose is preferably set to $2\times10^{14}$ atoms/cm$^2$ to $1\times10^{15}$ atoms/cm$^2$. A carbon dose of $2\times10^{14}$ atoms/cm$^2$ or more allows oxygen diffusing from the silicon wafer 10 to the first silicon epitaxial layer 12 to be sufficiently trapped. A carbon dose of $1\times10^{15}$ atoms/cm$^2$ or less can reduce damage to the surface 12A of the first silicon epitaxial layer.

A key aspect of the present disclosure is to obtain, after the third step (FIG. 1E), an epitaxial silicon wafer 100 wherein the peak concentration of the oxygen concentration profile in the first modifying layer 14 is $2\times10^{17}$ atoms/cm$^3$ or less and the oxygen concentration of the second silicon epitaxial layer 16 is $2\times10^{16}$ atoms/cm$^3$ or less. Below is discussed its technical significance. The term "concentration profile" herein means a concentration distribution in the depth direction as measured by secondary ion mass spectrometry (SIMS). The term "oxygen concentration of the second silicon epitaxial layer" herein means an average value of the oxygen concentration profile across the second silicon epitaxial layer in the depth direction when the oxygen concentration in the second silicon epitaxial layer is measured by SIMS.

The inventors focused on the peak concentration of the oxygen concentration profile in the first modifying layer and made extensive studies. As a result, they discovered that there is a remarkable increase in the gettering capability when the peak concentration of the oxygen concentration profile in the first modifying layer after formation of the second silicon epitaxial layer is set to $2\times10^{17}$ atoms/cm$^3$ or less and the oxygen concentration of the second silicon epitaxial layer is reduced to the SIMS detection lower limit value or less. The following describes a possible reason for this.

The first modifying layer includes gettering sites formed by irradiation with first ions. If the first modifying layer has a high oxygen concentration, most of the gettering sites are undesirably occupied by oxygen atoms. If oxygen atoms occupy most of the gettering sites, the gettering capability decreases as the gettering sites cannot completely trap metals. In contrast, according to the present disclosure, there is a significant increase in the gettering capability because the present disclosure makes it possible to reduce the number of oxygen atoms that occupy the gettering sites by setting the peak concentration of the oxygen concentration profile in the first modifying layer to $2\times10^{17}$ atoms/cm$^3$ or less. This also sufficiently reduces the diffusion of oxygen from the silicon wafer 10, so that the oxygen concentration of the second silicon epitaxial layer can also be reduced to the SIMS detection lower limit or less.

As a result of further studies conducted by the inventors, it was found that it is important to make the oxygen concentration in a surface layer portion of the first silicon epitaxial layer when applying carbon-containing first ions equal to or less than the SIMS detection lower limit value in order to set the peak concentration of the oxygen concentration profile in the first modifying layer to $2\times10^{17}$ atoms/cm$^3$ or less and to set the oxygen concentration of the second silicon epitaxial layer (to be a device layer) to $2\times10^{16}$ atoms/cm$^3$ or less (SIMS detection lower limit value or less).

Referring to FIGS. 1A to 1E and FIG. 3, the following describes a method of making the oxygen concentration in the surface layer portion of the first silicon epitaxial layer 12 before the second step equal to or less than the SIMS detection lower limit value ($2\times10^{16}$ atoms/cm$^3$).

Figure 3:
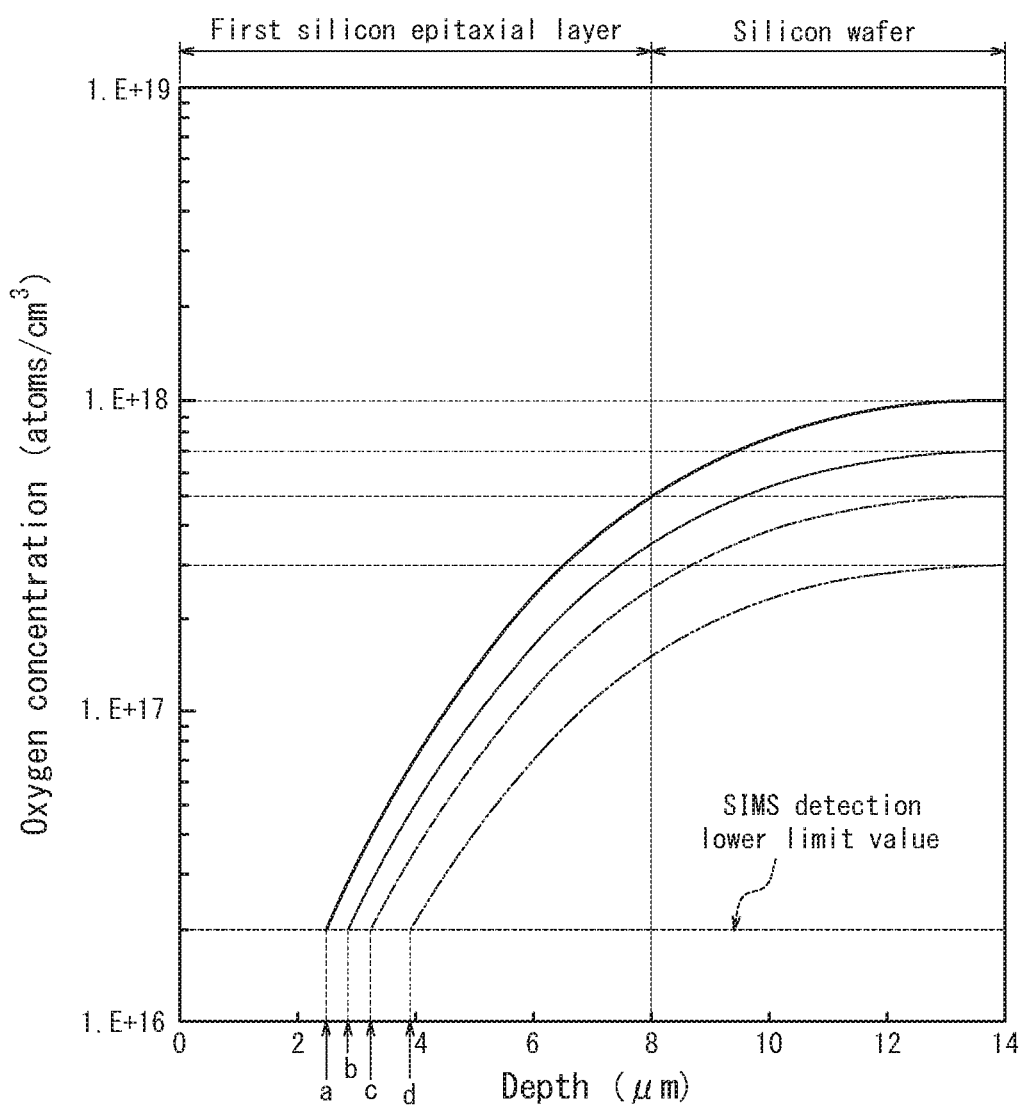
FIG. 3 is a graph showing the results of theoretical calculation of oxygen concentration profiles after growth of a first silicon epitaxial layer 12 for various oxygen concentrations of a silicon wafer.

Referring to FIGS. 1A and 1B, in the first embodiment of the present disclosure, the thickness of the first silicon epitaxial layer 12 is determined in the first step according to the oxygen concentration of the silicon wafer 10 such that the oxygen concentration in the surface layer portion of the first silicon epitaxial layer 12 before the second step equals to or less than the SIMS detection lower limit value. Referring to FIG. 3, the following describes an example of a method of determining the thickness of the first silicon epitaxial layer 12.

First, a proper oxygen diffusion coefficient can be set considering the epitaxial growth condition. Next, based on this diffusion coefficient of oxygen, as shown in FIG. 3, it is possible to obtain oxygen concentration profiles after growth of the first silicon epitaxial layer 12 for various oxygen concentrations of the silicon wafer 10 by theoretical calculation. In epitaxial growth, the thickness of the silicon epitaxial layer 12 to be formed may be increased by approximately 500 nm in the case of cluster ions or by approximately 0.5 μm to 1 μm in the case of monomer ions from the depth positions (a, b, c, d) in FIG. 3, where curves of oxygen concentration profile intersect with the straight line which indicates the SIMS detection lower limit value. Thus, it can be learned that the higher the oxygen concentration in the silicon wafer 10, the more thickness the first silicon epitaxial layer 12 requires in order to make the oxygen concentration in the surface layer portion of the first silicon epitaxial layer 12 equal to or less than the SIMS detection lower limit value.

Next, referring to FIGS. 2A to 2G, the following describes a method of manufacturing an epitaxial silicon wafer 200 according to a second embodiment of the present disclosure. The same elements as those in the first embodiments will not be described.

Figure 2A:
FIGS. 2A to 2G are schematic cross-sectional views illustrating a method of manufacturing an epitaxial silicon wafer 200 according to a second embodiment of the present disclosure.
Figure 2B:
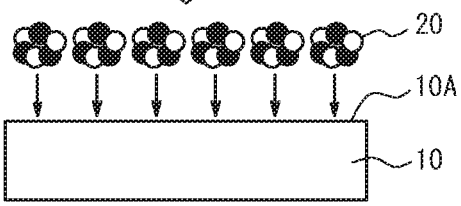
Figure 2C:
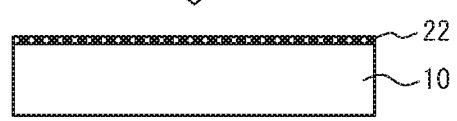
Figure 2D:
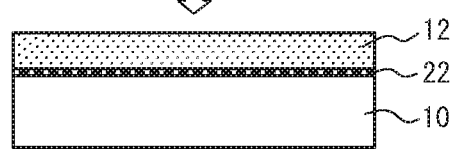
Figure 2E:
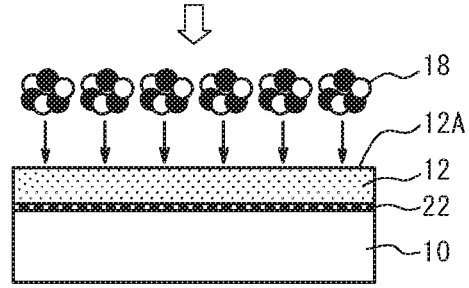
Figure 2F:
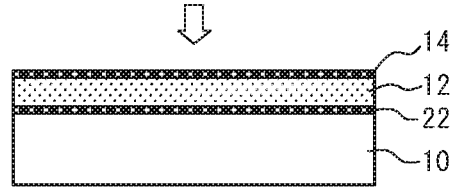
Figure 2G:
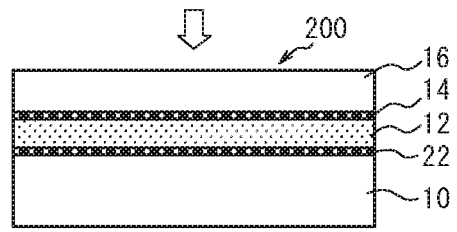

In the present embodiment, first, the silicon wafer 10 is irradiated with cluster ions 20 (second ions) containing carbon as a constituent element to form in a surface layer portion of the silicon wafer 10 a second modifying layer 22 in which the carbon is solidly dissolved (FIGS. 2A, 2B and 2C). Next, a first silicon epitaxial layer 12 is formed on the second modifying layer 22 (FIG. 2D). Next, the first silicon epitaxial layer 12 is irradiated with cluster ions 18 (first ions) containing carbon as a constituent element to form in a surface layer portion of the first silicon epitaxial layer 12 a first modifying layer 14 in which the carbon is solidly dissolved (FIGS. 2E and 2F). Next, a second silicon epitaxial layer 16 is formed on the first modifying layer 14 (FIG. 2G). FIG. 2G is a schematic cross-sectional view of an epitaxial silicon wafer 200 obtained by this manufacturing method.

From the viewpoint of enhancing the gettering capability of the second modifying layer 22, as the second ions, it is preferred to use cluster ions which contain carbon as a constituent element. Of note, irradiation conditions for the second ions can be the same as those for the first ions. In the second embodiment, the thickness of the first silicon epitaxial layer 12 is not particularly limited but is preferably 1 μm to 10 μm.

Thus, in the second embodiment, diffusion of oxygen present in the silicon wafer 10 into the first silicon epitaxial layer 12 can be reduced because the second modifying layer 22 formed in the surface layer portion of the silicon wafer 10 functions as a gettering layer for trapping the oxygen diffusing from the silicon wafer 10. As a result, it is possible to make the oxygen concentration in the surface layer portion of the first silicon epitaxial layer 12 before the second step equal to or less than the SIMS detection lower limit value.

A method of making the oxygen concentration in a surface layer portion of the first silicon epitaxial layer 12 equal to or less than the SIMS detection lower limit value has been described above for the first and second embodiments. It is noted, however, that any method can be used to make the oxygen concentration in the surface layer portion of the first silicon epitaxial layer 12 equal to or less than the SIMS detection lower limit value. For example, before the first step of forming the first silicon epitaxial layer, the silicon wafer may be subjected to oxygen out-diffusion heat treatment to form an oxygen out-diffusion layer in a surface layer portion of the silicon wafer. The following describes oxygen out-diffusion heat treatment.

By performing oxygen out-diffusion heat treatment, oxygen present in the surface layer portion of the silicon wafer is diffused outwardly (i.e., to the outside of the silicon wafer). This results in the formation of an oxygen out-diffusion layer having a lower oxygen concentration than the central portion of the silicon layer in the surface layer portion of the silicon wafer. Any condition can be used for the oxygen out-diffusion heat treatment as long as the oxygen concentration in the surface layer portion of the first silicon epitaxial layer can be reduced to the SIMS detection lower limit value or less. Specifically, oxygen out-diffusion heat treatment is performed in the temperature range of 1100° C. to 1250° C. for 1 hour to 5 hours. The oxygen out-diffusion heat treatment can be performed in any or known heat treatment furnace.

(Epitaxial Silicon Wafer)

Referring to FIGS. 1E and 2G, the following describes epitaxial silicon wafers 100, 200 obtained by the manufacturing methods described above. The epitaxial silicon wafers 100, 200 each include a silicon wafer 10, a first silicon epitaxial layer 12 formed on the silicon wafer 10, a first modifying layer 14 in which carbon is implanted in a surface layer portion of the first silicon epitaxial layer 12, and a second silicon epitaxial layer 16 on the first modifying layer 14. As shown in FIG. 2G, the epitaxial silicon wafer 200 further includes a second modifying layer 22 in which carbon is implanted in a surface layer portion of the silicon wafer 10. In each of the epitaxial silicon wafers 100, 200, the peak concentration of the oxygen concentration profile in the first modifying layer 14 is $2\times10^{17}$ atoms/cm$^3$ or less and the oxygen concentration of the second silicon epitaxial layer 16 is $2\times10^{16}$ atoms/cm$^3$ or less.

The oxygen concentration of the silicon wafer 10 is preferably $2\times10^{17}$ atoms/cm$^3$ to $18\times10^{17}$ atoms/cm$^3$. The peak concentration of the carbon concentration profile in the first modifying layer 14 is preferably $3.8\times10^{18}$ atoms/cm$^3$ to $1.2\times10^{20}$ atoms/cm$^3$. The dopant concentration of the first silicon epitaxial layer 12 is preferably equal to or less than the dopant concentration of the second silicon epitaxial layer 16, and the first silicon epitaxial layer 12 is preferably a silicon epitaxial layer which is not doped with a dopant. The reasons for these are as discussed above.

Thus, according to the epitaxial silicon wafers 100, 200 of the present embodiments, it is possible to reduce metal contamination by exerting high gettering capability.

(Method of Manufacturing Solid-State Image Sensing Device)

A method of manufacturing a solid-state image sensing device according to an embodiment of the present disclosure involves formation of a solid-state image sensing device in the second silicon epitaxial layer 16 of the epitaxial silicon wafer 100, 200 manufactured by the method described above or of the epitaxial silicon wafer 100, 200 described above. Solid-state image sensing devices obtained by this manufacturing method are more sensitive and produce less white spot defects than conventional ones.

The present disclosure has been described based on representative embodiments, which however shall not be construed as limiting the scope of the present disclosure.

EXAMPLES

Inventive Example

A silicon wafer (300 mm across and 725 μm thick) having an oxygen concentration (ASTM F121-1979) of $14\times10^{17}$ atoms/cm$^3$ was prepared from a CZ monocrystalline silicon ingot.

Next, the silicon wafer was transferred into a single wafer processing epitaxial growth apparatus (Applied Materials, Inc.) and subjected to hydrogen baking at 1,120° C. for 30 seconds in the apparatus. A first silicon epitaxial layer of 8 μm thickness was then epitaxially grown on the silicon wafer by CVD at 1,150° C. using hydrogen as a carrier gas and trichlorosilane as a source gas. The oxygen concentration of the first silicon epitaxial layer in a region of 500 nm from the surface was not greater than the SIMS detection lower limit ($2.0\times10^{16}$ atoms/cm$^3$) as measured by SIMS. Of note, the first silicon epitaxial layer was not doped with a dopant.

Next, $C_3H_5$ cluster ions generated from cyclohexane using a cluster ion generator (Nissin Ion Equipment Co., Ltd., model: CLARIS) were applied to the surface of the first silicon epitaxial layer at a carbon dose of $1.0\times10^{15}$ atoms/cm$^2$ at an acceleration voltage of 80 keV/Cluster to convert a surface layer portion of the first silicon epitaxial layer into a first modifying layer.

Next, a second silicon epitaxial layer (thickness: 8 μm, dopant type: phosphorus, dopant concentration: $9\times10^{13}$ atoms/cm$^3$) was formed on the first modifying layer by the same method as that used for the formation of the first silicon epitaxial layer.

A carbon concentration profile was measured by SIMS. The first modifying layer was able to be identified by confirming the presence of a steep peak in the range of 80 nm from the surface of the first silicon epitaxial layer. The peak value of the carbon concentration profile in the first silicon epitaxial layer was $1\times10^{20}$ atoms/cm$^3$.

Comparative Example 1

An epitaxial silicon wafer was obtained by the same manufacturing method as in Inventive Example except that the surface of the silicon wafer was irradiated with cluster ions without forming the first silicon epitaxial layer.

Comparative Example 2

An epitaxial silicon wafer was obtained by the same manufacturing method as in Inventive Example except that the thickness of the first silicon epitaxial layer was set to 0.5 μm. The oxygen concentration of the first silicon epitaxial layer in a region of 500 nm from the surface before irradiation with cluster ions was $7\times10^{17}$ atoms/cm$^3$ as measured by SIMS.

Comparative Example 3

An epitaxial silicon wafer was obtained by the same manufacturing method as in Inventive Example except that the thickness of the first silicon epitaxial layer was set to 6.0 µm. The oxygen concentration of the first silicon epitaxial layer in a region of 500 nm from the surface before irradiation with cluster ions was $3\times10^{16}$ atoms/cm$^3$ as measured by SIMS.

(Evaluation Method)

In Inventive Example and Comparative Examples, the following evaluation was made.

<Oxygen Concentration Distribution Measured by SIMS>

Figure 4A:
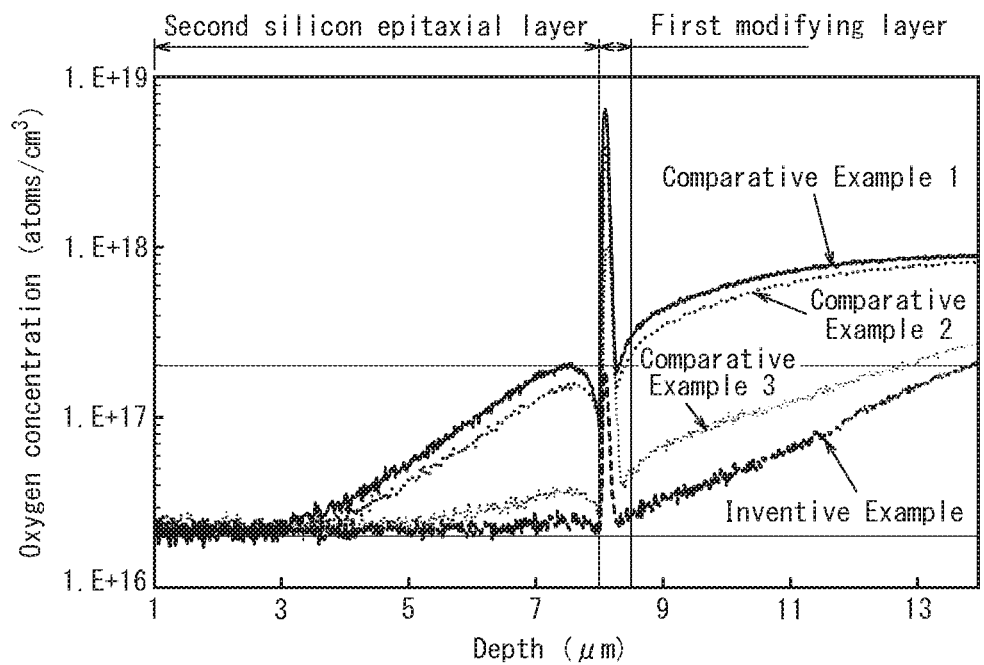
FIG. 4A is a graph showing oxygen concentration profiles of epitaxial silicon wafers for Inventive Example and Comparative Examples 1 to 3.

In Inventive Example and Comparative Examples, the oxygen concentration after formation of the second silicon epitaxial layer was measured by secondary ion mass spectrometry (SIMS). The measurement results are shown in FIG. 4A.

<Evaluation of Gettering Capability>

Figure 4B:
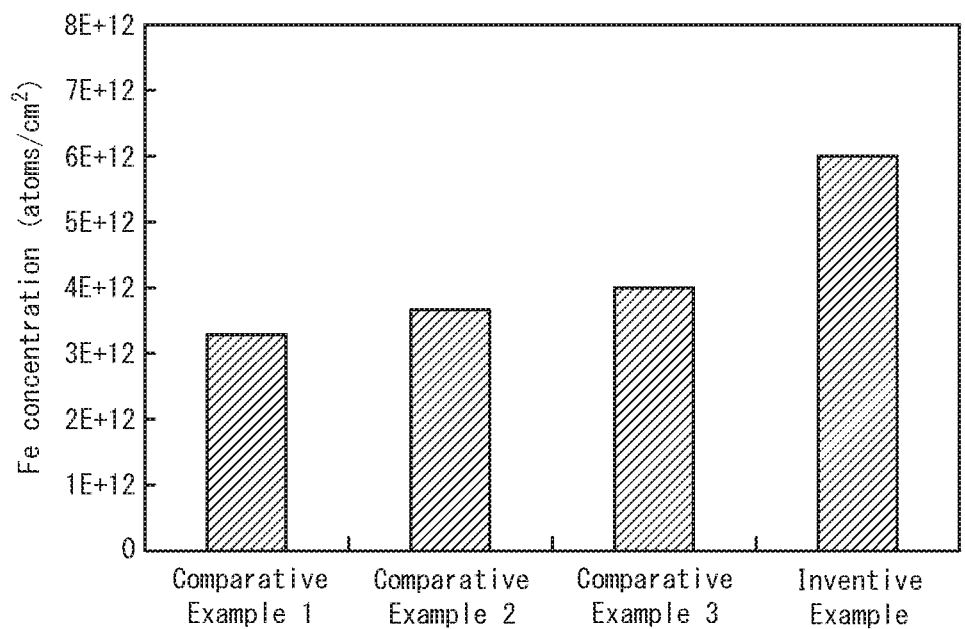
FIG. 4B is a graph showing peak concentrations of Fe trapped in the first modifying layer for Inventive Example and Comparative Examples 1 to 3.

The surface of the epitaxial silicon wafer samples prepared in Inventive Example and Comparative Examples 1 to 3 was intentionally contaminated with an Fe-contaminated liquid ($1\times10^{13}$ atoms/cm$^2$) by the spin coat contamination method, and subsequently heated at 1,050° C. for 2 hours. The Fe concentration was then measured by SIMS. Peak concentrations of concentration profiles of Fe trapped in the first modifying layer for Inventive Example and Comparative Examples are shown in FIG. 4B.

(Explanation of Evaluation Results)

First, in Comparative Examples 1 to 3, as shown in FIG. 4A, the peak concentration of the oxygen concentration profile in the first modifying layer was greater than $2\times10^{17}$ atoms/cm$^3$. In addition, the oxygen concentration in the second silicon epitaxial layer was greater than $2\times10^{16}$ atoms/cm$^3$. Thus, as shown in FIG. 4B, Comparative Examples 1 to 3 all showed low gettering capability. In contrast, in Inventive Example, as shown in FIG. 4A, the peak concentration of the oxygen concentration profile in the first modifying layer was not greater than $2\times10^{17}$ atoms/cm$^3$ and the oxygen concentration in the second silicon epitaxial layer was constantly not greater than the SIMS detection lower limit value in depth direction. At this point of time, as shown in FIG. 4B, the gettering capability showed a significant increase.

INDUSTRIAL APPLICABILITY

According to the present disclosure, it is possible to provide an epitaxial silicon wafer which can reduce metal contamination by exerting higher gettering capability, and a method of manufacturing the same.

REFERENCE SIGNS LIST 100, 200 Epitaxial silicon wafer
10 Silicon wafer
10A Silicon wafer surface
12 First silicon epitaxial layer
12A First silicon epitaxial layer surface
14 First modifying layer
16 Second silicon epitaxial layer
18 Carbon-containing cluster ions (first ions)
20 Carbon-containing cluster ions (second ions)
22 Second modifying layer

The invention claimed is:

1. A method of manufacturing an epitaxial silicon wafer, comprising:

forming a first silicon epitaxial layer having a surface layer portion with an oxygen concentration of $2\times10^{16}$ atoms/cm$^3$ or less on a silicon wafer that has an oxygen concentration of $2\times10^{17}$ atoms/cm$^3$ or more:

irradiating the surface layer portion of the first silicon epitaxial layer with first ions containing carbon to form in the surface layer portion of the first silicon epitaxial layer a first modifying layer in which the carbon is implanted; and forming a second silicon epitaxial layer on the first modifying layer, wherein after the forming the second silicon epitaxial layer, the epitaxial silicon wafer is obtained wherein a peak concentration of an oxygen concentration profile in the first modifying layer is $2\times10^{17}$ atoms/cm$^3$ or less, and an oxygen concentration of the second silicon epitaxial layer is $2\times10^{16}$ atoms/cm$^3$ or less, and wherein a thickness of the first silicon epitaxial layer is adjusted according to the oxygen concentration of the silicon wafer such that the surface layer portion of the first silicon epitaxial layer has an oxygen concentration of $2\times10^{16}$ atoms/cm$^3$ or less.

2. The method according to claim 1, wherein the first ions are cluster ions which contain carbon as a constituent element.

3. The method according to claim 1, further comprising, before the forming the first silicon epitaxial layer, irradiating the silicon wafer with second ions containing carbon to form in a surface layer portion of the silicon wafer a second modifying layer in which the carbon is implanted, such that the surface layer portion of the first silicon epitaxial layer before the irradiating the surface layer portion of the first silicon epitaxial layer has an oxygen concentration of $2\times10^{16}$ atoms/cm$^3$ or less.

4. The method according to claim 3, wherein the second ions are cluster ions which contain carbon as a constituent element.

5. The method according to claim 1, wherein the first silicon epitaxial layer has a dopant concentration that is equal to or less than a dopant concentration of the second silicon epitaxial layer.

6. The method according to claim 5, wherein the first silicon epitaxial layer is not doped with a dopant.

7. An epitaxial silicon wafer comprising:

a silicon wafer that has an oxygen concentration of $2\times10^{17}$ atoms/cm$^3$ or more;
a first silicon epitaxial layer formed on the silicon wafer;
a first modifying layer in which carbon is implanted, the first modifying layer being formed in a surface layer portion of the first silicon epitaxial layer; and
a second silicon epitaxial layer formed on the first modifying layer, wherein a thickness of the first silicon epitaxial layer is configured such that a peak concentration of an oxygen concentration profile in the first modifying layer is $2\times10^{17}$ atoms/cm$^3$ or less and an oxygen concentration of the second silicon epitaxial layer is $2\times10^{16}$ atoms/cm$^3$ or less.

8. The epitaxial silicon wafer according to claim 7, wherein the first silicon epitaxial layer has a dopant concentration that is equal to or less than a dopant concentration of the second silicon epitaxial layer.

9. The epitaxial silicon wafer according to claim 8, wherein the first silicon epitaxial layer is not doped with a dopant.

10. A method of manufacturing a solid-state image sensing device, comprising:

forming a solid-state image sensing device in the second silicon epitaxial layer of the epitaxial silicon wafer manufactured by the method according to claim 1.

11. A method of manufacturing a solid-state image sensing device, comprising:
    forming a solid-state image sensing device in the second silicon epitaxial layer of the epitaxial silicon wafer according to claim 7.

\* \* \* \* \*